United States Patent
Beck et al.

(10) Patent No.: US 10,191,133 B2
(45) Date of Patent: Jan. 29, 2019

(54) MR IMAGING USING MULTI-ECHO SEGMENTED K-SPACE ACQUISITION

(71) Applicant: KONINKLIJKE PHILIPS N.V., Eindhoven (NL)

(72) Inventors: Gabriele Marianne Beck, Eindhoven (NL); Gerrit Hendrik Van Ijperen, Eindhoven (NL)

(73) Assignee: KONINKLIJKE PHILIPS N.V, Eindhoven (NL)

( * ) Notice: Subject to any disclaimer, the term of this patent is extended or adjusted under 35 U.S.C. 154(b) by 229 days.

(21) Appl. No.: 15/102,560

(22) PCT Filed: Dec. 4, 2014

(86) PCT No.: PCT/EP2014/076478
§ 371 (c)(1),
(2) Date: Jun. 8, 2016

(87) PCT Pub. No.: WO2015/086415
PCT Pub. Date: Jun. 18, 2015

(65) Prior Publication Data
US 2016/0313431 A1    Oct. 27, 2016

(30) Foreign Application Priority Data
Dec. 12, 2013  (EP) .................................... 13196861

(51) Int. Cl.
*G01R 33/565*    (2006.01)
*G01R 33/48*    (2006.01)
*G01R 33/561*    (2006.01)

(52) U.S. Cl.
CPC ..... *G01R 33/56509* (2013.01); *G01R 33/482* (2013.01); *G01R 33/4818* (2013.01);
(Continued)

(58) Field of Classification Search
CPC .............. G01R 33/4824; G01R 33/482; G01R 33/4818; G01R 33/56509; G01R 33/5616; G01R 33/5617
(Continued)

(56) References Cited

U.S. PATENT DOCUMENTS 5,402,067 A    3/1995    Pauly et al.
6,255,820 B1    7/2001    Steckner
(Continued)

FOREIGN PATENT DOCUMENTS

WO    9914616 A1    3/1999

OTHER PUBLICATIONS

Lustig et al "Sparse MRI: The Application of Compressed Sensing for Rapid MR Imaging" Magnetic Resonance in Medicine, 58, p. 1182-1195 (2007).
(Continued)

*Primary Examiner* — Amy He

(57) ABSTRACT

An object (10) is placed in an examination volume of a MR device (1) and imaged using a multi-echo imaging technique which is robust with respect to motion. The imaging includes subjecting the object (10) to a number of shots of a multi-echo imaging sequence to generate a train of echo signals by each shot and acquiring the echo signals. Each echo signal represents a k-space profile, wherein k-space (20) is divided into a central k-space part (21) and one or more peripheral k-space parts (22, 23). The central k-space part (21) is sampled by a single shot of the multi-echo imaging sequence, and the peripheral k-space parts (22, 23) are sampled by one or more further shots (25, 28) of the multi-echo sequence; and an MR image is reconstructed from the k-space profiles.

14 Claims, 4 Drawing Sheets

(52) U.S. Cl.
CPC ..... *G01R 33/4824* (2013.01); *G01R 33/5616* (2013.01); *G01R 33/5617* (2013.01)

(58) Field of Classification Search
USPC .................................................. 324/309, 307
See application file for complete search history.

(56) References Cited

U.S. PATENT DOCUMENTS

| 6,912,302 | B2 | 6/2005 | Sato | |
|---|---|---|---|---|
| 2003/0011368 | A1 | 1/2003 | Abe | |
| 2003/0102864 | A1 | 6/2003 | Welch et al. | |
| 2006/0273791 | A1 | 12/2006 | Beck | |
| 2008/0061779 | A1* | 3/2008 | Feiweier | G01R 33/4818 324/307 |
| 2012/0112745 | A1 | 5/2012 | Takizawa | |
| 2012/0286777 | A1 | 11/2012 | Frost | |
| 2013/0251225 | A1* | 9/2013 | Liu | G01R 33/5673 382/131 |
| 2013/0307537 | A1* | 11/2013 | Yoshizawa | G01R 33/5617 324/309 |
| 2014/0035582 | A1* | 2/2014 | Boernert | G01R 33/5611 324/312 |

OTHER PUBLICATIONS

Huang et al "Data Convolution and Combination Operation (COCOA) for Motion Ghost Artivacts Reduction" Magnetic Resonance in Medicine vol. 64, p. 157-166 (2010).

Sachs et al "Real-Time Motion Detection in Spiral MRI Using Navigators" Magnetic Resonance in Med. vol. 33, Jan. 1, 1994, p. 639-645.

Mori et al "A Motion Correction Scheme by Twin-Echo Navigation for Diffusion-Weighted Magnetic Resonance.." vol. 40, Issue 4, p. 511-516, 1998.

* cited by examiner

MR IMAGING USING MULTI-ECHO SEGMENTED K-SPACE ACQUISITION

CROSS REFERENCE TO RELATED APPLICATIONS

This application is a U.S. national phase application of International Application No. PCT/EP2014/076478, filed on Dec. 4, 2014, which claims the benefit of EP Application Ser. No. 13196861.2filed on Dec. 12, 2013and is incorporated herein by reference.

FIELD OF THE INVENTION

The invention relates to the field of magnetic resonance (MR) imaging. It concerns a method of MR imaging of an object. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for imaging of soft tissue they are superior to other imaging methods in many respects, do not require ionizing radiation and are usually not invasive.

According to the MR method in general, the object, for example the body of the patient to be examined, is arranged in a strong, uniform magnetic field whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse), so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

To realize spatial resolution in the body, constant magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The signal data obtained via the receiving coils corresponds to the spatial frequency domain and is called k-space data. The k-space data usually includes multiple lines acquired with different phase encoding. Each line is digitized by collecting a number of samples. A set of k-space data is converted to a MR image by means of an image reconstruction algorithm.

The so-called 'Turbo Spin Echo' (TSE) sequence is a well-known multi-echo imaging sequence. One 'shot' of the TSE sequence comprises an initial RF pulse for excitation of magnetic resonance followed by a plurality of rapidly applied (typically 180°) refocusing RF pulses generating a train of differently phase-encoded spin echo signals. The echo signals are acquired, wherein each echo signal represents a k-space profile, i.e. a one-dimensional sample of k-space, the position of the k-space profile in k-space being determined by the applied frequency encoding and phase encoding switched magnetic field gradients of the sequence. The so-called 'Turbo Factor' (TF) is the number of echoes acquired after each excitation. Typically, a plurality of shots of the multi-echo sequence is applied for completely sampling k-space in order to be able to reconstruct a MR image from the acquired k-space profiles. k-space is typically segmented such that each segment is attributed to one echo index number in the train of echoes generated by each shot of the sequence. In other words, each shot typically acquires k-space profiles from all segments of k-space, with the number of segments in k-space being equal to TF.

TSE sequences are applied today in almost all applications. Despite its wide use it is known to be very sensitive to motion due to the segmented k-space distributed acquisition. Small movements of the imaged object, for example of subcutaneous fat, can introduce ghosts overlapping with the part of interest disturbing the overall diagnostic value of a scan.

The above-mentioned k-space segmentation principles and problems do apply to both spin echo (TSE) and gradient echo sequences (TFE) and 'Echo Planar Imaging'—EPI—sequences.

The US-patent application US2006/0273791 discloses a magnetic resonance imaging method in which the order of acquired k-space profiles in ech sub-set is generally different from the order of the other profile subsets.

SUMMARY OF THE INVENTION

From the foregoing it is readily appreciated that there is a need for an improved MR imaging technique. It is consequently an object of the invention to enable fast MR imaging using a multi-echo imaging technique which is more robust with respect to motion.

In accordance with the invention, a method of MR imaging of an object placed in an examination volume of a MR device is disclosed. The method comprises the steps of:
  subjecting the object to a number of shots of a multi-echo imaging sequence, a train of echo signals being generated by each shot, acquiring the echo signals, wherein each echo signal represents a k-space profile, wherein k-space is divided into a central k-space part and one or more peripheral k-space parts, wherein the central k-space part is sampled by a single shot of the multi-echo imaging sequence, and wherein the peripheral k-space parts are sampled by one or more further shots of the multi-echo sequence, and reconstructing a MR image from the k-space profiles.

The invention proposes to acquire central k-space in a single shot. Thus, with the central k-space part being sampled at essentially a single point in time the sensitivity to motion is effectively reduced.

It has to be noted that the formulation 'acquisition in a single shot' includes the variant that central k-space is sampled by only a subset of the train of echo signals of a single shot, wherein the remaining echo signals of the respective shot are used to sample peripheral k-space positions.

According to a preferred embodiment of the invention, sampling of the peripheral k-space parts starts at a position in k-space where the sampling of the central k-space part starts and/or the sampling of the peripheral k-space parts ends at a position in k-space where the sampling of the central k-space part ends. The peripheral acquisition starts and ends in k-space at the start and end points of the central acquisition respectively to avoid discontinuities in signal amplitude and/or phase that would manifest in image artefacts.

More generally expressed, the k-space sampling is preferably performed according to the invention such that the k-space profiles acquired from adjacent positions in k-space have adjacent (i.e. consecutive) or identical echo index numbers, wherein the consecutive echo index numbers indicate the temporal position of each echo signal within the train of echo signals.

In three-dimensional (3D) acquisitions k-space segmentation may be two-dimensional, for example in $k_y$ and $k_z$. In a preferred embodiment of the invention, not only start and end points of peripheral and central k-space sampling are to be aligned, but possibly all k-space segments of central and peripheral k-space parts should be aligned in order to avoid discontinuities in signal amplitude and/or phase.

The approach of the invention renders it possible to adapt the sampling strategy for central and peripheral k-space parts separately as needed for the respective application.

According to a preferred embodiment of the invention, the multi-echo imaging sequence of the invention is a spin echo sequence comprising at least one RF pulse for excitation of magnetic resonance,
a plurality of refocusing RF pulses,
a plurality of switched magnetic field gradients for frequency-encoding of each echo signal, and
a plurality of switched magnetic field gradients for phase-encoding of each echo signal. In other words, the method of the invention may be applied in combination with per-se known 'turbo' spin echo sequences, such as TSE or spin echo-type EPI.

Alternatively, the multi-echo imaging sequence is a gradient echo sequence comprising at least one RF pulse for excitation of magnetic resonance,
a plurality of switched magnetic field gradients for refocusing magnetic resonance and for frequency-encoding of each echo signal, and
a plurality of switched magnetic field gradients for phase-encoding of each echo signal. In other words, the method of the invention may be applied in combination with per-se known 'turbo' gradient echo sequences, such as TFE or EPI.

The method of the invention is particularly well-suited to be combined with Cartesian k-space sampling schemes. However, the method may as well be applied in combination with non-Cartesian sampling, such as PROPELLER or spiral scans. For all types of k-space sampling, the term 'central k-space part' within the meaning of the invention refers to k-space profiles close to the k-space origin.

With regard to PROPELLER scanning it is known that single shot PROPELLER blade acquisitions typically are very robust with respect to motion as compared to multi-shot PROPELLER approaches. The combination of the invention with PROPELLER means that central k-space profiles of each PROPELLER blade are acquired in a single shot while peripheral k-space profiles of each PROPELLER blade are segmented using further shots of the applied multi-echo sequence. This results in a motion-resistant multi-shot PROPELLER acquisition.

According to a further preferred embodiment of the invention, at least a part of k-space is incompletely sampled. This means, for example, that the method of the invention can be combined with techniques such as the per se known 'partial matrix' technique or the 'compressed sensing' (CS) technique.

'Partial matrix' is a scan time reduction method that takes advantage of the complex conjugate property of k-space. Since k-space profiles from negative k-space positions are substantially identical to complex conjugate k-space profiles from corresponding positive k-space positions, only a peripheral positive or negative part may be sampled in accordance with the invention in order to replicate a sampling of the entire k-space. This results in a significant reduction in scan time while full resolution is maintained.

According to yet another preferred embodiment of the invention, k-space is sampled with variable density. This means, in other words, that the k-space profiles acquired from the peripheral k-space parts may be irregularly distributed in the phase-encoding direction. This may be employed in order to further reduce scan time by motion-optimized variable density compressed sensing. The theory of CS is known to have a great potential for significant signal data reduction. In CS theory, a signal data set which has a sparse representation in a transform domain can be recovered from undersampled measurements by application of a suitable regularisation algorithm. The possibility of undersampling leads to a significantly reduced acquisition time. As a mathematical framework for signal sampling and reconstruction, CS prescribes the conditions under which a signal data set can be reconstructed exactly or at least with high image quality even in cases in which the k-space sampling density is far below the Nyquist criterion, and it also provides the methods for such reconstruction. In most existing CS-based MR acquisition and reconstruction schemes the basic CS formulation is used which exploits only the prerequisite that the MR signal data is sparse in a transform domain. For example, M. Lustig et al. have proposed the application of CS for rapid MR imaging (M. Lustig et al.: "Sparse MRI: The Application of Compressed Sensing for Rapid MR Imaging", Magnetic Resonance in Medicine, 58, 1182-1195, 2007). It is also known that, since additional prior information about the unknown MR image may be available in certain applications, it is advantageous to incorporate this prior information into the CS reconstruction.

According to a further preferred embodiment of the invention, at least the central part of k-space is sampled with several acquisitions for the purpose of signal averaging in order to compensate for FID and motion artefacts. This means that the method of the invention can be combined with partial averaging, wherein different signal averaging is applied in central and peripheral k-space respectively.

According to yet another preferred embodiment, detection of motion of the object is performed during acquisition of the echo signals, wherein k-space profiles acquired during motion of the object from the peripheral k-space parts are discarded.

Motion may be detected, for example, by the per se known navigator technique. For this purpose, the acquisition of navigator echoes may be incorporated into the method of the invention. Alternatively motion may be detected by the use of k-space consistency criteria or by internal and/or external motion sensors (e.g. breathing sensor).

If motion is detected at a certain point during the acquisition of k-space profiles from a peripheral part, this k-space profile (or all k-space profiles acquired by the respective shot) may be discarded and known iterative reconstruction algorithms or POCS like methods may be used to reconstruct a motion-free image.

'Projections onto Convex Sets' (POCS) is a powerful mathematical tool for reconstruction of incomplete and/or inconsistent MR data. It is known to be well-suited for MR image reconstruction from partial k-space data.

Another possibility to detect motion in a shot is to recognize k-space inconsistencies between different shots. For example, the known COCOA approach (Data Convolution and Combination Operation for Motion Ghost Artefacts Reduction') may be applied in combination with the method of the invention. COCOA is presently used to perform post processing of k-space data to reduce motion artefacts. Samples from a k-space kernel area are used for detecting and correcting motion-corrupted k-space samples. Based on the acquired k-space samples, neighboring k-space samples can be estimated (see Feng Huang et al., Magnetic Resonance in Medicine, 64, 157-166, 2010). In accordance with the invention, the k-space kernel used in COCOA may be derived from the k-space samples acquired from the central k-space part.

In contrast to the k-space profile order in conventional multi-echo techniques, removing a (motion-corrupted) k-space profile from the peripheral k-space part according to the invention does not affect central k-space, so the mentioned reconstruction techniques will be more successful.

The method of the invention described thus far can be carried out by means of a MR device including at least one main magnet coil for generating a uniform static magnetic field within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit. The method of the invention can be implemented, for example, by a corresponding programming of the reconstruction unit and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
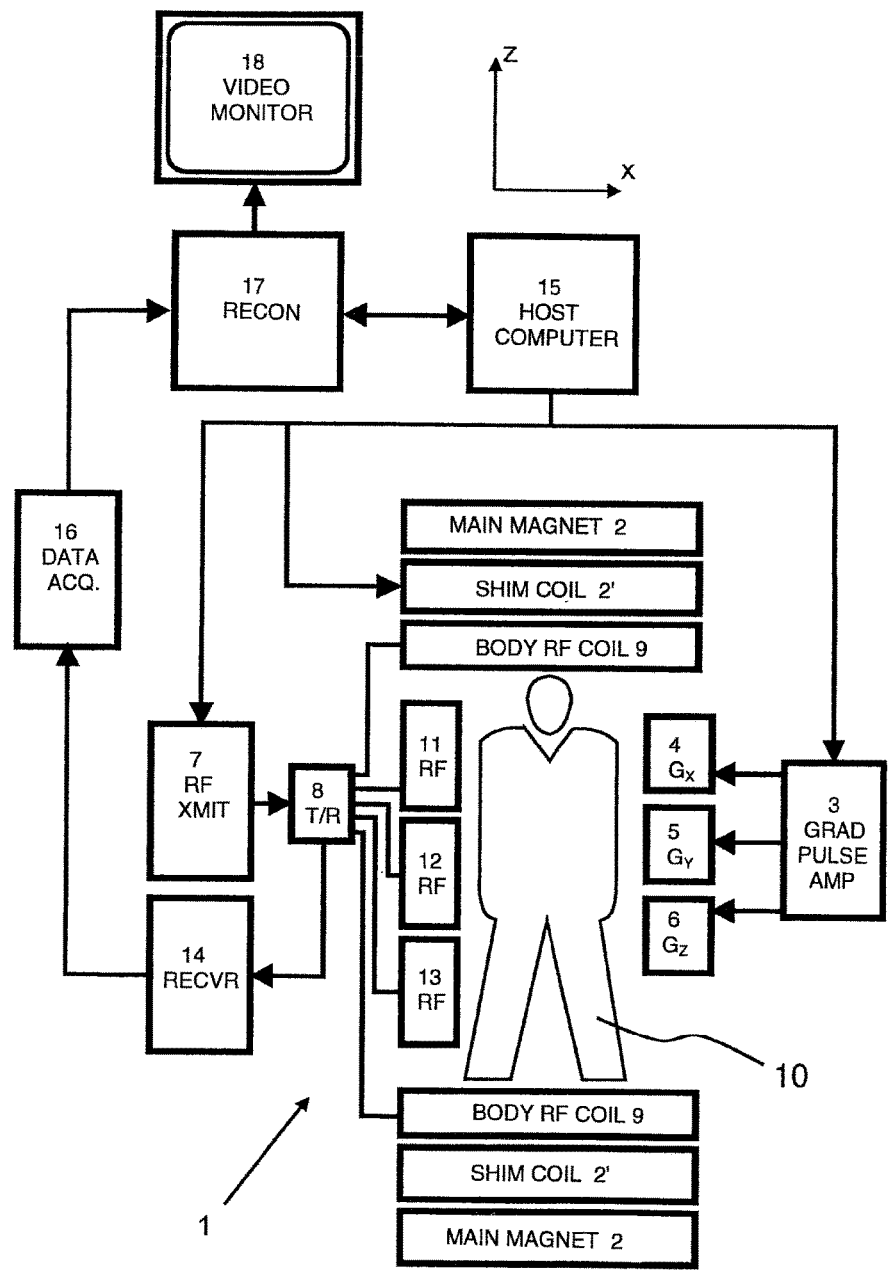
FIG. 1 shows a MR device for carrying out the method of the invention.

With reference to FIG. 1, a MR device 1 is shown. The device comprises superconducting or resistive main magnet coils 2 such that a substantially uniform, temporally constant main magnetic field is created along a z-axis through an examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

Most specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a whole-body volume RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the whole-body volume RF coil 9.

For generation of MR images of limited regions of the body 10, a set of local array RF coils 11, 12, 13 are placed contiguous to the region selected for imaging. The array coils 11, 12, 13 can be used to receive MR signals induced by body-coil RF transmissions.

The resultant MR signals are picked up by the whole body volume RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the gradient pulse amplifier 3 and the transmitter 7 to generate any of a plurality of MR imaging sequences, such as echo planar imaging (EPI), echo volume imaging, gradient and spin echo imaging, fast spin echo (TSE) imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

With continuing reference to FIG. 1 and with further reference to FIGS. 2-7, embodiments of the imaging approach of the invention are explained.

Figure 2:
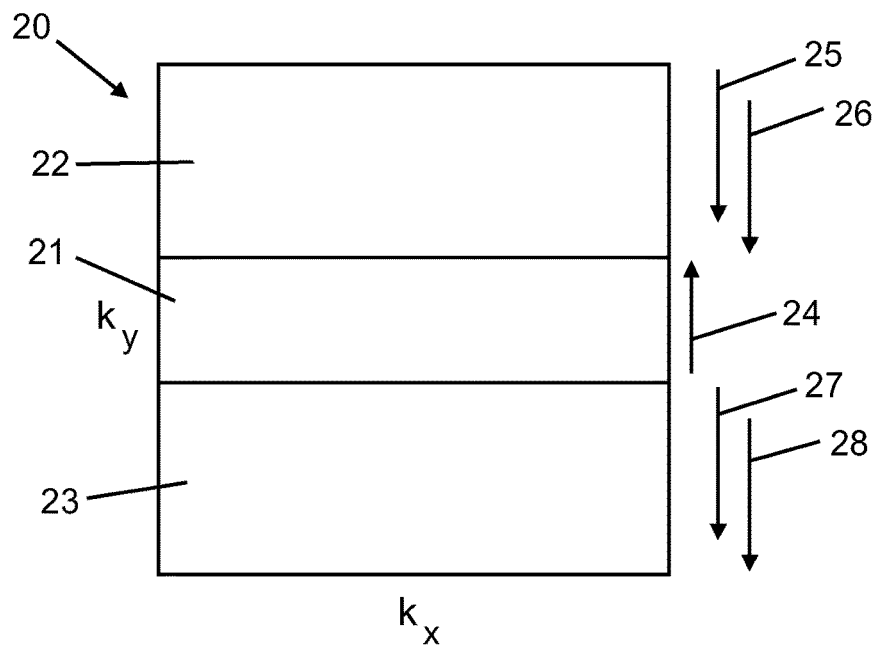
FIG. 2 shows a diagram of k-space schematically illustrating a first embodiment of the sampling scheme of the invention.

As shown in FIG. 2, k-space 20 is divided into a central k-space part 21, a positive peripheral k-space part 22, and a negative peripheral k-space part 23. The central k-space part 21 is completely sampled by a single shot of a TSE sequence which is indicated by arrow 24. Arrow 24 indicates the direction of k-space sampling, i.e. the order of echoes generated by the applied single shot of the multi-echo sequence. Each of the peripheral k-space parts 22, 23 is sampled by at least two further shots of the multi-echo sequence. This is indicated by arrows 25, 26 and 27, 28. The shots 25, 26 and 27, 28 sample the respective peripheral k-space part 22, 23 in an interleaved fashion. The arrows 25, 26 and 27, 28 again indicate the order of echoes generated by the respective shots of the multi-echo sequence. As can be seen from the directions of the arrows, the samplings 27, 28 of the peripheral k-space part 23 start at a position where the sampling 24 of the central k-space part starts, while the samplings 25, 26 of the peripheral k-space part 22 end at a position in k-space where the sampling 24 of the central k-space part 21 ends. In case motion is detected in, for example, shot 26, the k-space profiles of this shot can be discarded and appropriate iterative reconstruction, COCOA or POCS-like methods can be used to reconstruct a motion-free MR image. Removing the profiles of shot 26 does not affect the central k-space part 21, so the discarding of the k-space profiles can be expected to induce only an insignificant amount of artefacts.

Figure 3:
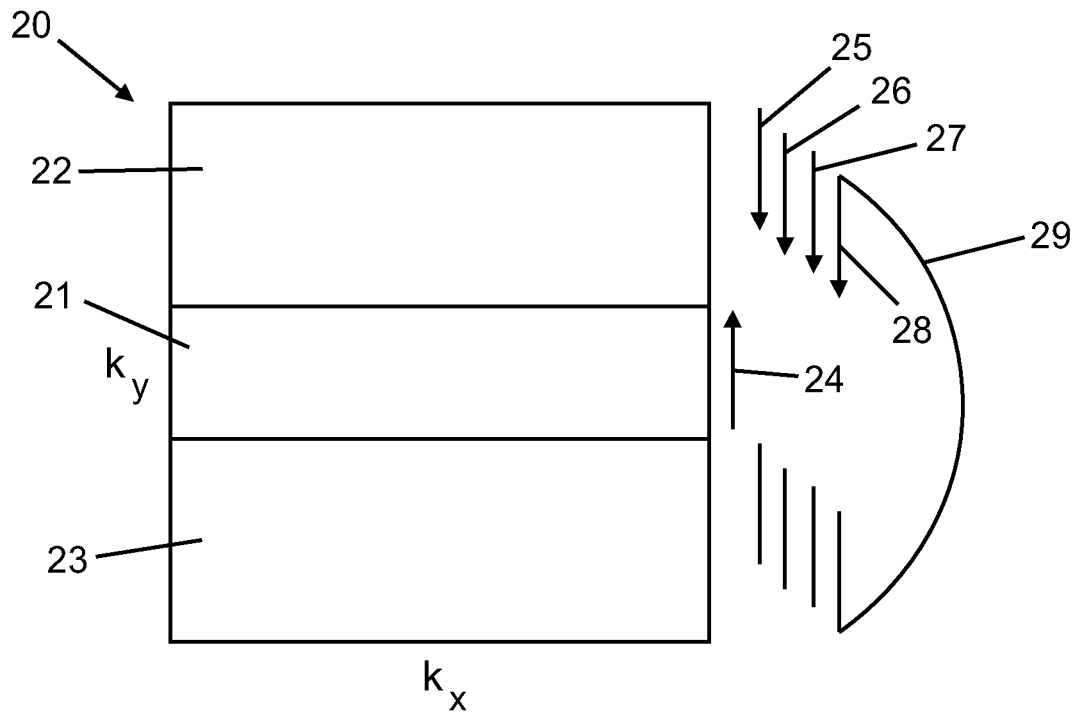
FIG. 3 shows a diagram of k-space schematically illustrating a second embodiment of the sampling scheme of the invention.
Figure 4:
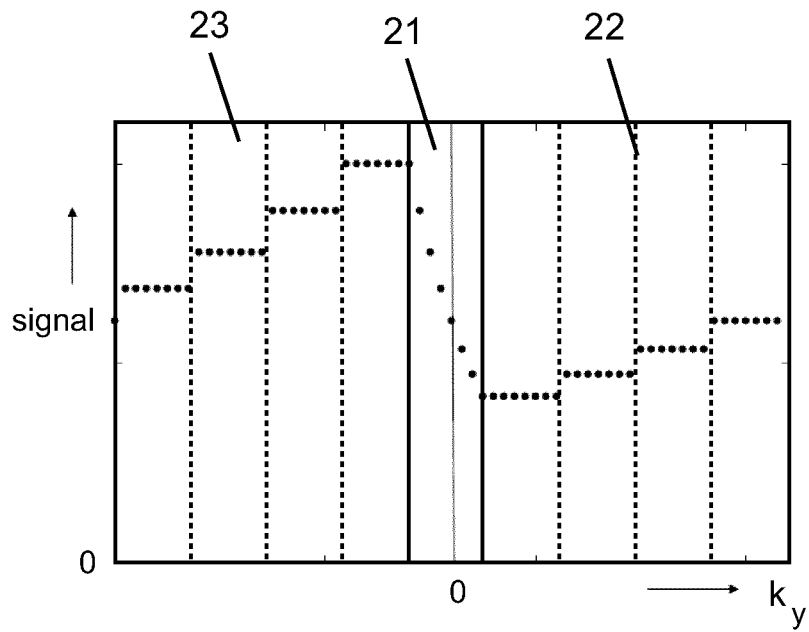
FIG. 4 shows a diagram of signal amplitude as a function of k-space position resulting from the k-space sampling scheme of the invention

In the embodiment shown in FIG. 3, the peripheral k-space parts, 22, 23 are sampled by multi-echo shots 25, 26, 27, 28, again starting acquiring k-space profiles at the starting position of sampling of the central k-space part 21 and ending acquiring at the ending position of central k-space scanning, with a jump of phase-encoding from the minimum $k_y$ value to the maximum $k_y$ value, as indicated by the connecting arc 29. FIG. 4 shows the corresponding behaviour of the echo signal amplitude as a function of k-space position (in the phase-encoding direction $k_y$). Each dot in the diagram indicates a single echo signal. As can be seen in the diagram, any signal discontinuities are effectively avoided. The diagram of FIG. 4 also shows the segmentation of the peripheral k-space parts 22, 23 by the dashed lines as well as the 'non-segmented' acquisition of the central k-space part 21 in accordance with the invention.

Figure 5:
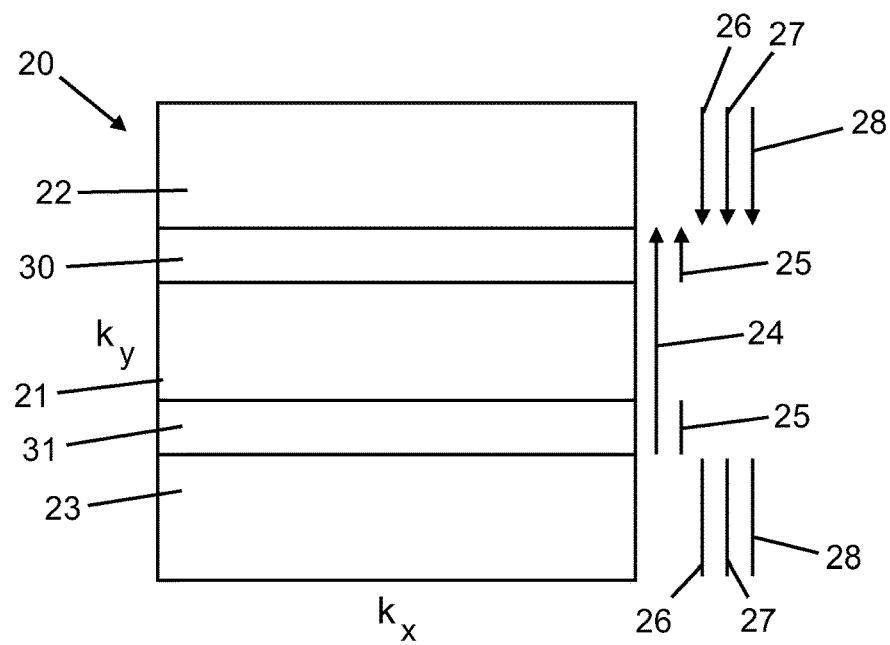
FIG. 5 shows a diagram of k-space schematically illustrating a third embodiment of the sampling scheme of the invention.

According to yet another embodiment, only part of a single shot 24 is used for sampling of the central k-space part 21, as shown in FIG. 5. This may be useful for very long shots, with a very large ($T_2$-induced) signal variation from start to end. In the embodiment shown in FIG. 5, k-space 20 is divided into central k-space part 21 and peripheral k-space parts 22, 23, 30, 31, wherein k-space parts 30, 31 can be referred to as intermediate k-space parts. The intermediate k-space parts 30, 31 are sampled in a multi-shot fashion by applying shots 24 and 25. The intermediate k-space parts 30, 31 may be divided differently in positive and negative k-space. Peripheral k-space parts 22, 23 are sampled by shots 26, 27, 28. In this embodiment, the samplings 26, 27, 28 of the peripheral k-space part 23 start at a position where the samplings 24, 25 of the 'extended' central k-space part (constituted by parts 21, 30, 31) starts, while the samplings 26, 27, 28 of the peripheral k-space part 22 end at a position in k-space where the samplings 24, 25 of the parts 21, 30, 31 ends.

All samplings 24, 25, 26, 27, 28 of the embodiments shown in FIGS. 2-5 apply a linear order of k-space profiles with respect to phase-encoding.

Figure 6:
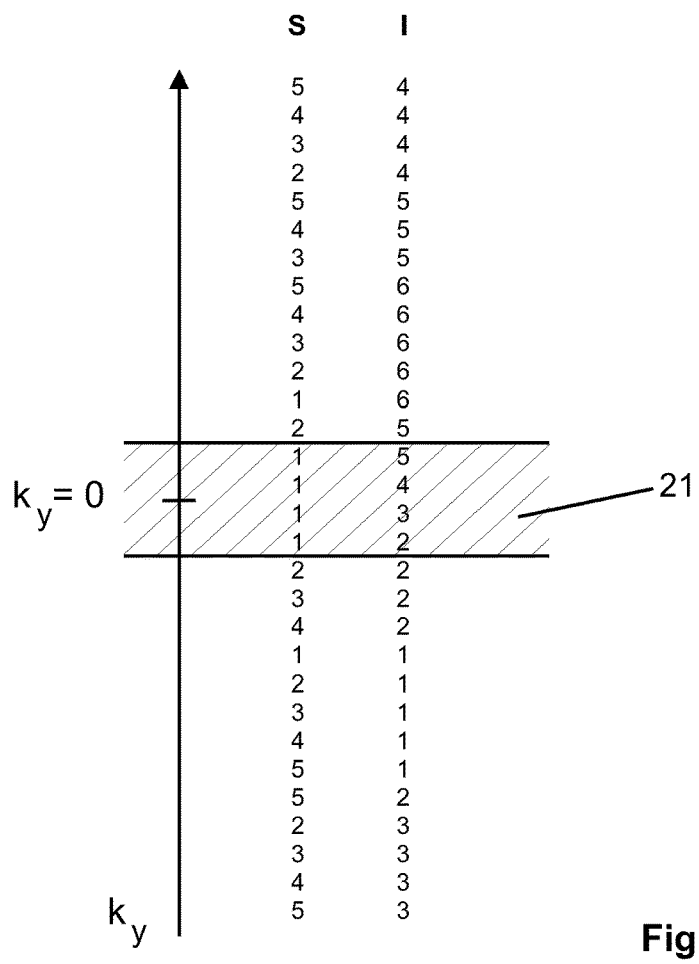
FIG. 6 shows the shot numbers and echo index numbers attributed to k-space positions according to a fourth embodiment of the invention.

FIG. 6 illustrates a specific implementation of the sampling scheme of FIG. 5. The diagram shows the shot number S and the echo index number I, the latter indicating the serial number of each echo signal within the train of consecutive echo signals generated by the respective shot of the TSE sequence. As can be seen, the k-space profiles acquired from adjacent positions in k-space have successive or identical echo index numbers. In the depicted example, five shots of a TSE sequence using a linear profile order with a turbo factor of six are applied. Shot 1 (S=1) starts acquisition at an intermediate part and jumps to the central k-space part 21 which is acquired in a single shot. Shots 2-6 (S=2-6) acquire the peripheral k-space parts.

The sampling scheme shown in FIGS. 5 and 6 allow tuning $T_2$ related contrast changes over k-space. In case of a typical exponential $T_2$ decay the stronger decay in the positive peripheral k-space parts 22, 30 can be tuned by adapting the sizes of the segments. The turbo factor and the total number of shots can be kept the same. The $T_2$ signal distribution is only reordered by shifting larger $T_2$ differences furthermore to outer k-space.

The method of the invention may be combined with flip angle sweeps as it is typically used in TSE methods in order to maintain magnetization as long as possible in each shot. The flip angle variation during the TSE readout may be adapted to the k-space segmentation in order to optimize the imaging result.

The method of the invention may be combined with existing methods to compensate for $T_2$ blurring, like, e.g., reversing the k-space profile order. Also combinations with partial averaging, k-space consistency navigators ('ONAV') and/or compressed sensing are relevant in the context of the invention. In particular, the invention enables a motion robust variable k-space density approach as needed for compressed sensing.

Combining partial averaging, compressed sensing and the k-space profile order concept of the invention allows to easily acquire the central part 21 of k-space two or more times for sufficient signal-to-noise (SNR) and FID artefact suppression, whereas a variable density stochastic approach may be applied to achieve a denser k-space sampling close to the central part 21 with, e.g., a Poisson disk distribution. It is possible to discard motion corrupted data from the variable density acquisition, taking advantage from the compressed sensing reconstruction.

Also respiratory triggering, breath hold approaches and also more critical k-space consistency rejection mechanisms in the central k-space part are imaginable in the context of the invention in order to account for motion of the imaged object.

Figure 7:
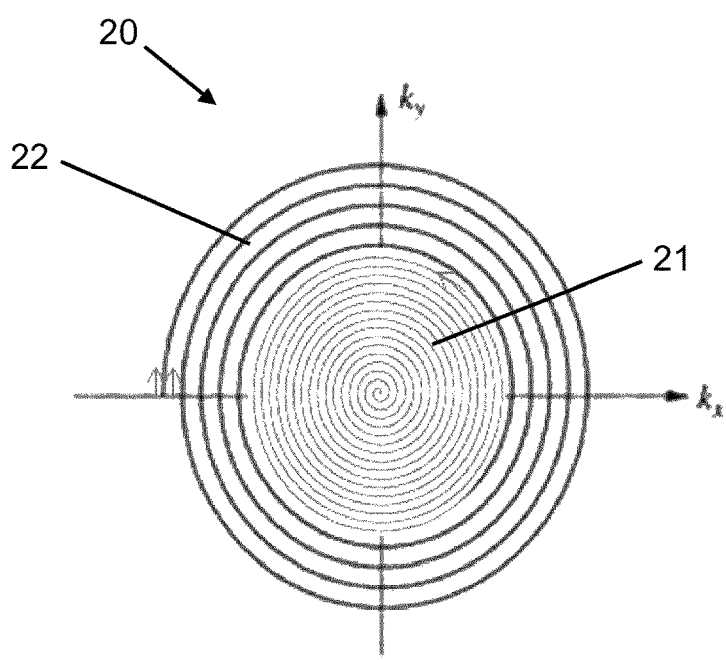
FIG. 7 shows a diagram of k-space schematically illustrating a forth embodiment of the invention with spiral sampling.

As demonstrated in FIGS. 2-6, the method of the invention is particularly well-suited to be combined with Cartesian k-space sampling schemes. However, the method may as well be applied in combination with non-Cartesian sampling, such as spiral scanning, as shown in FIG. 7. The central k-space part 21 is scanned by a single shot of a multi-echo sequence with a spiral k-space trajectory progressing from the k-space origin outwards. The peripheral k-space part 22 is scanned along a contra-rotating spiral k-space trajectory progressing from the outer boundary of k-space inwards, wherein the spiral sampling of the peripheral k-space part 22 ends at a position in k-space where the sampling of the central k-space part 21 ends.

Although the method of the invention has been illustrated above in the context of two-dimensional imaging, it can as well be applied for three-dimensional (3D) imaging without departing from the spirit of the invention. In 3D imaging, as mentioned above, k-space segmentation can be two-dimensional in $k_y$ and $k_z$. Hence, in a preferred embodiment of the invention, not only start and end points of peripheral and central k-space acquisitions are aligned but also k-space segments and respective echo signal index numbers of central and peripheral k-space parts. In an exemplary embodiment, central k-space can be defined as an elliptical centric $k_y$-$k_z$ part that is acquired in a single shot (or part of a single shot). The start and end points of the elliptical central k-space acquisition shot are aligned with start and end points of the shots of the peripheral k-space acquisitions.

The invention claimed is:

1. A method of magnetic resonance (MR) imaging of an object placed in an examination volume of a MR device, the method comprising the steps of:
    subjecting the object to a number of shots of a multi-echo imaging sequence, a train of echo signals being generated by each shot,
    acquiring the echo signals, wherein each echo signal represents a k-space profile, wherein k-space is divided into a central k-space part and one or more peripheral k-space parts, wherein the central k-space part is sampled by a single shot of the multi-echo imaging sequence, and wherein the peripheral k-space parts are sampled by one or more further shots of the multi-echo sequence,
    wherein sampling of the peripheral k-space parts starts at a position in k-space where the sampling of the central k-space part starts and/or the sampling of the peripheral k-space parts ends at a position in k-space where the sampling of the central k-space part ends,
    wherein the k-space profiles acquired from adjacent positions in k-space have adjacent or identical echo index numbers, the echo index number indicating the position of each echo signal within the train of echo signals generated by each shot of the multi-echo imaging sequence, and
    reconstructing a MR image from the k-space profiles.

2. The method of claim 1, wherein the multi-echo imaging sequence is a spin echo sequence comprising:
    at least one radio frequency (RF) pulse for excitation of magnetic resonance,
    a plurality of refocusing RF pulses,
    a plurality of switched magnetic field gradients for frequency-encoding of each echo signal, and
    a plurality of switched magnetic field gradients for phase-encoding of each echo signal.

3. The method of claim 2, wherein the multi-echo imaging sequence is a TFE sequence or a TSE sequence.

4. The method of claim 1, wherein the multi-echo imaging sequence is a gradient echo sequence comprising:
    at least one radio frequency (RF) pulse for excitation of magnetic resonance,
    a plurality of switched magnetic field gradients for refocusing magnetic resonance and for frequency-encoding of each echo signal, and
    a plurality of switched magnetic field gradients for phase-encoding of each echo signal.

5. The method of claim 1, wherein the central and peripheral k-space parts are sampled on a Cartesian sampling grid.

6. The method of claim 1, wherein the central and peripheral k-space parts are parts of individual k-space blades in a PROPELLER acquisition.

7. The method of claim 1, wherein the central and peripheral k-space parts are sampled along spiral trajectories in k-space.

8. The method of claim 1, wherein at least a part of the peripheral k-space parts is incompletely sampled.

9. The method of claim 1, wherein k-space is sampled with variable density.

10. The method of claim 1, wherein the central k-space part is acquired two or more times for signal averaging.

11. The method of claim 1, wherein detection of motion of the object is performed, wherein k-space profiles acquired during motion of the object from the peripheral k-space parts are discarded.

12. The method of claim 1, wherein the MR image is reconstructed using compressed sensing.

13. A magnetic resonance (MR) device including at least one main magnet coil for generating a uniform, static magnetic field within an examination volume, a number of gradient coils for generating switched magnetic field gradients in different spatial directions within the examination volume, at least one RF coil for generating radio frequency (RF) pulses within the examination volume and/or for receiving MR signals from an object positioned in the examination volume, a control unit for controlling the temporal succession of RF pulses and switched magnetic field gradients, and a reconstruction unit, wherein the MR device is arranged to perform the following steps:
    subjecting the object to a number of shots of a multi-echo imaging sequence, a train of echo signals being generated by each shot,
    acquiring the echo signals, wherein each echo signal represents a k-space profile, wherein k-space is divided into a central k-space part and one or more peripheral k-space parts, wherein the central k-space part is fully sampled by a single shot of the multi-echo imaging sequence, and wherein the peripheral k-space parts are sampled by one or more further shots of the multi-echo sequence, starting sampling of the peripheral k-space parts at a position in k-space where the sampling of the central k-space part starts and/or ending the sampling of the peripheral k-space parts at a position in k-space where the sampling of the central k-space part ends, wherein the k-space profiles acquired from adjacent positions in k-space have adjacent or identical echo index numbers (I), the echo index number (I) indicating the position of each echo signal within the train of echo signals generated by each shot of the multi-echo imaging sequence, and reconstructing a MR image from the k-space profiles.

14. A non-transitory computer-readable medium carrying a computer program to be run on a processor of a magnetic resonance (MR) device, which computer program controls the MR device for:

producing a number of shots of a multi-echo imaging sequence, a train of echo signals being generated by each shot, acquiring the echo signals, wherein each echo signal represents a k-space profile, wherein k-space is divided into a central k-space part and one or more peripheral k-space parts, wherein the central k-space part is sampled by a single shot of the multi-echo imaging sequence, and wherein the peripheral k-space parts are sampled by one or more further shots of the multi-echo sequence, starting sampling of the peripheral k-space parts at a position in k-space where the sampling of the central k-space part starts and/or ending the sampling of the peripheral k-space parts at a position in k-space where the sampling of the central k-space part ends, wherein the k-space profiles acquired from adjacent positions in k-space have adjacent or identical echo index numbers (I), the echo index number (I) indicating the position of each echo signal within the train of echo signals generated by each shot of the multi-echo imaging sequence and reconstructing a MR image from the k-space profiles.

\* \* \* \* \*